United States Patent [19]

Khan

[11] 4,412,905

[45] Nov. 1, 1983

[54] VACUUM DEPOSITION APPARATUS

[75] Inventor: Mohammed N. Khan, Wembley, England

[73] Assignee: Dowty Electronics Limited, Acton, England

[21] Appl. No.: 489,162

[22] Filed: Apr. 27, 1983

[30] Foreign Application Priority Data

May 12, 1982 [GB] United Kingdom ................. 8213847

[51] Int. Cl.$^3$ ............................................ C23C 15/00
[52] U.S. Cl. ................................. 204/298; 204/192 R
[58] Field of Search ......................................... 204/298

[56] References Cited

U.S. PATENT DOCUMENTS

| 3,616,450 | 10/1971 | Clark | 204/298 |
| 4,094,764 | 6/1978 | Boucher et al. | 204/298 |
| 4,155,825 | 5/1979 | Fournier | 204/192 R |

Primary Examiner—Arthur P. Demers
Attorney, Agent, or Firm—Hayes, Davis & Soloway

[57] ABSTRACT

A vacuum deposition apparatus including a cathode, an anode associated with the substrate to be coated and permanent magnet means whose lines of force are directed substantially parallel to the surface of the substrate, at least closely adjacent to that surface, and whose strength is such as to divert high-energy electrons away from the surface in order substantially to prevent them bombarding that surface.

1 Claim, 2 Drawing Figures

VACUUM DEPOSITION APPARATUS

This invention relates to vacuum deposition apparatus and in particular, but not exclusively, to sputtering apparatus.

In a sputtering apparatus the plasma usually contains, in those parts of the sputtering chamber which are remote from the electrodes, unwanted ions of the sputtering gas and low-energy electrons.

In the gap between the electrodes, however, the plasma contains high-energy ions which bombard the target, energetic neutral particles of the material to be sputtered which will coat a surface of a substrate, high-energy electrons which hit the substrate, and photons which arise from the recombinations of ions and electrons.

The bombardment of the substrate, during sputtering, by high-energy electrons can have a deleterious effect on the sputtered film, particularly when the material being sputtered is a dielectric material, e.g. silicon dioxide.

It is an object of this invention to provide an improved vacuum deposition apparatus.

According to this invention a vacuum deposition apparatus includes a cathode, an anode associated with the substrate to be coated, and means providing a magnetic field whose lines of force are directed substantially parallel to the surface of the substrate to be coated and are at least closely adjacent to that surface and whose strength is such as to divert high-energy electrons away from, and substantially prevent them bombarding, the surface.

The vacuum deposition apparatus may be a sputtering apparatus.

Figure 1:
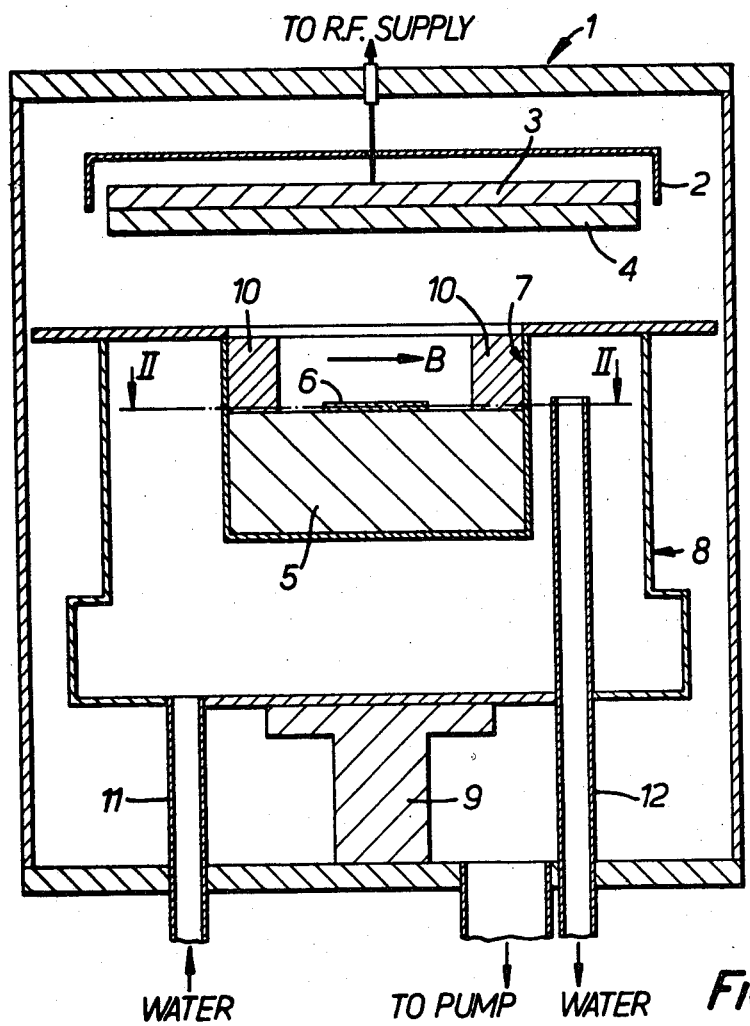
Figure 2:
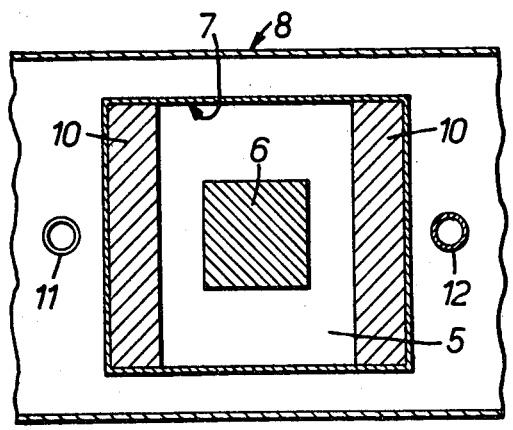

One embodiment of a sputtering apparatus in accordance with one embodiment of the invention, given by way of example, is illustrated in the accompanying drawings of which FIG. 1 is a vertical sectional view of the apparatus, and FIG. 2 is a section taken along the line II—II of FIG. 1.

Referring to the drawings, the illustrative apparatus includes a chamber 1 which can be connected to a suitable pump (not shown) for evacuating the chamber.

Near to one end of the chamber there are disposed an earthed metal shield 2, a backing plate 3 and a cathode 4. The cathode 4 is connected to a source of high-power radio-frequency signals (not shown) by way of the backing plate.

Within another part of the chamber there are disposed a worktable 5 which supports a substrate 6 having a surface to be coated. The worktable 5 is within a rectangular recess 7 in an anode structure 8. The anode structure 8 is connected to the earthed base plate of the chamber 1 by means of a connector flange 9. The anode structure of this embodiment of the invention is hollow and water cooled. To that end, the apparatus includes a water inlet pipe 11 and a water outlet pipe 12.

Also within the rectangular recess there are permanent magnets 10 which provide a uniform magnetic field. The lines of force of the magnetic field extend substantially parallel to the surface of the substrate 6 to be coated, say in the direction B shown in FIG. 1, and extend someway beyond the substrate 6 towards but not as far as the region adjacent the cathode 4. As mentioned later, the field strength is of a certain value.

In operation the anode structure 8 is at earth potential and will be kept water cooled. A high-power radio-frequency signal is applied to the cathode 4. The application of that signal ionises a sputtering gas which fills the chamber at low pressure; the ions produced bombard the cathode 4 and cause sputtering.

The earthed metal shield 2 prohibits the sputtering of material from the backing plate 3.

The neutral particles of material to be sputtered will coat the surface of the substrate 6.

Any high-energy electrons which enter the region close to the surface to be coated will come under the influence of the magnetic field of the permanent magnets 10. The magnetic field is of such a strength that the trajectory of the electrons will be changed, causing them to move along the lines of force, which extend substantially parallel to the surface to be coated, in a helical trajectory away from the surface of the substrate to be coated. The electrons will, eventually, bombard the earthed anode structure instead of the substrate.

The strength of the magnetic field depends on the energy of the electrons and can readily be computed from the equation:

$$B = mV/er$$

where
  m is the electronic mass
  e is the electronic charge
  V is the electronic velocity
and
  r is the radius of the helical trajectories of electrons along the magnetic field direction The magnetic field produced by the permanent magnets does not extend to the region adjacent the cathode and has a negligible effect on the heavier ions which bombard the cathode and which cause sputtering.

In addition to the magnetic field produced in the region of the substrate (in the above-described embodiment, produced by the permanent magnets 10), another magnetic field, known in the art of cathode sputtering, may be generated by other magnetic-field-producing means in the region of the cathode to increase the rate of sputtering.

I claim:

1. A vacuum deposition apparatus including a cathode, an anode associated with the substrate to be coated, and means providing a magnetic field whose lines of force are directed substantially parallel to the surface of the substrate to be coated, are at least closely adjacent to that surface and are of such strength as substantially to direct high-energy electrons away from the surface.

* * * * *